United States Patent [19]

Bittner et al.

[11] 4,099,816

[45] Jul. 11, 1978

[54] ELECTRICAL CONNECTOR SYSTEM

[75] Inventors: John E. Bittner, Inver Grove Heights; Robert S. Dodsworth, North St. Paul, both of Minn.

[73] Assignee: Minnesota Mining and Manufacturing Company, St. Paul, Minn.

[21] Appl. No.: 803,206

[22] Filed: Jun. 3, 1977

Related U.S. Application Data

[63] Continuation of Ser. No. 689,976, May 26, 1976, abandoned.

[51] Int. Cl.² .............................................. H05K 1/12
[52] U.S. Cl. ......................... 339/17 CF; 339/176 MP
[58] Field of Search ............. 339/17 CF, 18 R, 18 B, 339/174, 176 M, 176 MP, 191 M

[56] References Cited

U.S. PATENT DOCUMENTS

| 2,799,839 | 7/1957 | Weiss | 339/191 M |
| 3,188,599 | 6/1965 | Roberts | 339/17 CF |
| 3,918,784 | 11/1975 | Lemke | 339/17 CF |

Primary Examiner—Roy Lake
Assistant Examiner—E. F. Desmond
Attorney, Agent, or Firm—Cruzan Alexander; Donald M. Sell; Terryl K. Qualey

[57] ABSTRACT

An electrical connector system which may be used to prototype electrical circuits utilizing standard integrated circuit packages on a perforated circuit board. A plurality of spring contact elements having oppositely directed resilient jaws are carried in an insulating housing. An insulating contact retainer, carrying a plurality of spring compression reserve wire contact elements, is placed on the opposite surface of the perforated circuit board from the connector housing, with a tail of each contact element extending through a perforation in the circuit board into one set of jaws of a spring contact element aligned with the perforation. The contact leads of an integrated circuit package are similarly inserted into the oppositely directed, spring contact element jaws. Electrical contact to the contact leads of the integrated circuit package is then made through the spring contact elements and the wire contact elements to wires connected by the wire contact elements.

6 Claims, 3 Drawing Figures

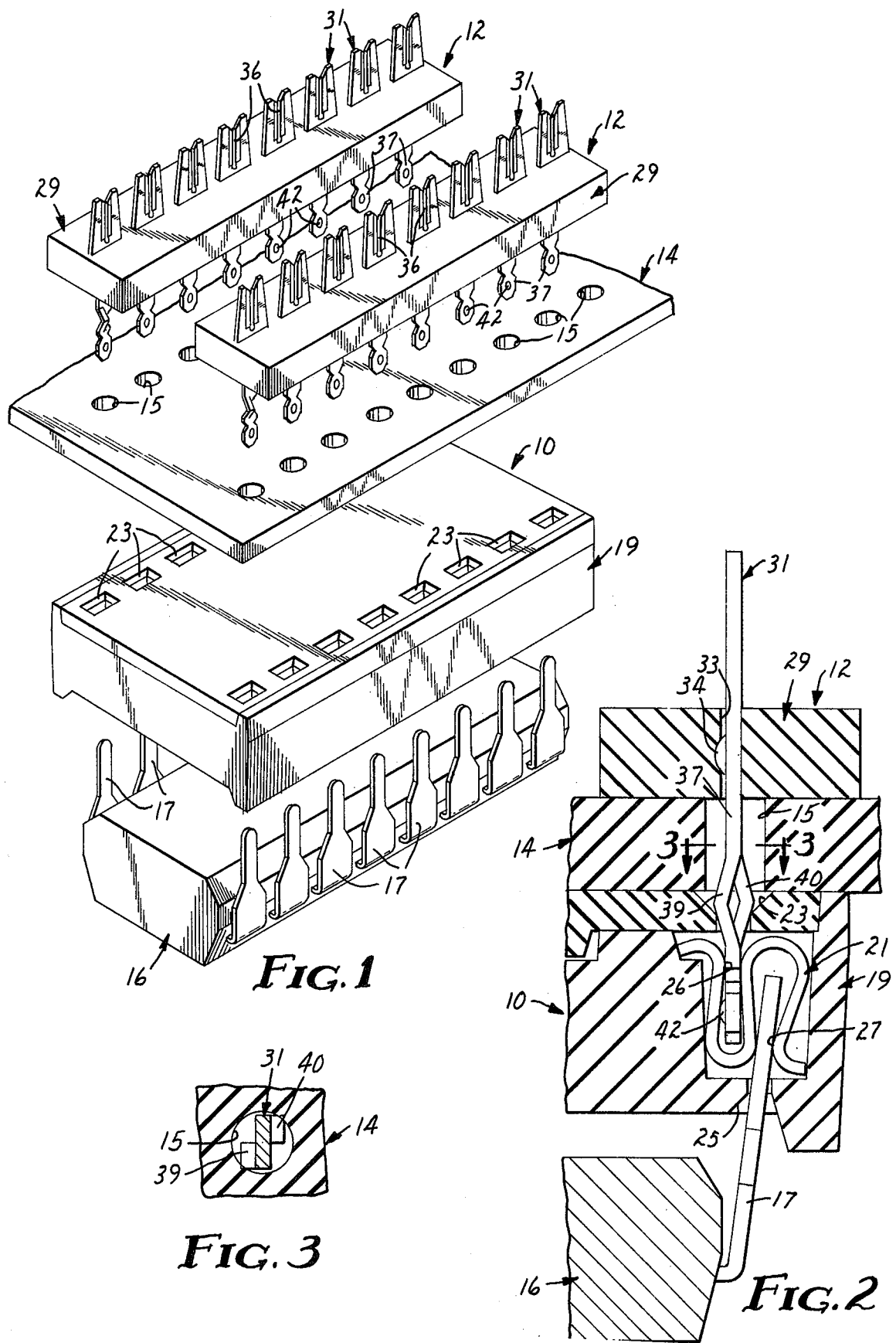

ELECTRICAL CONNECTOR SYSTEM

REFERENCE TO RELATED APPLICATION

This application is a continuation of Ser. No. 689,976 filed May 26, 1976, now abandoned.

FIELD OF THE INVENTION

The present invention relates to an electrical connector system particularly adapted for use in prototyping electrical circuits using integrated circuit packages on a perforated circuit board.

BACKGROUND OF THE INVENTION

Electronic circuitry today typically makes use of integrated circuit wafers or chips mounted on standardized interconnection packages which have protruding therefrom a number of electrical connecting leads in a standardized pattern for connection into larger circuit assemblies. The connection of the integrated circuit packages with other electronic assemblies has typically been by direct soldering, or by inserting the electrical leads of the integrated circuit package into receptacles in an insulating housing, the connection being continued through the housing to the circuit board. Such integrated circuit connectors are disclosed in U.S. Pat. Nos. 3,602,874; 3,624,586; 3,673,551; 3,673,543; 3,683,317; 3,710,299; and 3,883,207.

When prototyping electronic circuits utilizing integrated circuit packages, it is obviously desirable to have the wiring and components in the position that they will occupy in the commercially produced circuit, both in terms of size and location. Moreover, it is highly desirable that not only the integrated circuit package be readily removable and replaceable, but that the electrical interconnection wiring also be readily changeable. Such versatility has not previously been available in electronic circuitry prototyping.

SUMMARY OF THE INVENTION

The present invention provides an electrical connector system for use with a perforated circuit board, and includes a connector body comprising an insulating housing having a plurality of apertures therethrough, the aperture openings at one face of the housing being spaced to align with perforations in the circuit board. A plurality of spring contact elements are retained in the housing, one within each aperture therethrough; each spring element being formed of a metal strip, and having a pair of adjacent, oppositely directed, resilient jaws, one pair of jaws being aligned with an opening at said one face of the housing, and the oppositely directed pair of jaws being aligned with the apertures opening at the opposite face of the housing. A contact strip for making connection through the perforated circuit board into the connector body comprises an insulating contact retainer having a plurality of contact apertures therethrough, the aperture openings at one face of the contact strip being spaced to align with perforations in the circuit board and the openings at said one face of the connector body housing. A plurality of spring compression reserve contact elements are retained one in each of the contact apertures in the insulating contact retainer. Each contact element has a spring compression reserve contact slot accessible at the surface of the contact retainer opposite said one surface thereof, and having a tail extending from said one surface of the contact retainer to fit through a perforation in the circuit board and an aligned aperture in said one surface of the connector body housing into the aligned resilient jaws of a spring contact element.

One set of jaws of a spring contact element in the connector receives an electrical lead of an integrated circuit package, while the oppositely directed set of jaws receives the tail of a spring compression reserve wire contact element. Electrical connection is thereby made from the integrated circuit package through the spring contact element and the spring compression reserve wire contact element to one or more wires in the wire contact slot of the contact element. The electrical leads or tails of the integrated circuit package are readily inserted and removed from the spring contact elements to permit ready removal and replacement of the integrated circuit package, and the spring compression reserve wire contact elements permit easy wiring and re-wiring of the circuit.

THE DRAWING

In the drawing:

FIG. 1 is an exploded perspective view of the components of an electrical connector system in accordance with the present invention in use with an integrated circuit package and a perforated printed circuit board;

FIG. 2 is a cross-sectional view illustrating one complete connection of the electrical connector system of FIG. 1; and FIG. 3 is a cross-sectional view taken generally along line 3—3 of FIG. 2.

The electrical connector system of the present invention comprises a connector body 10 and a contact strip 12. The connector body 10 and contact strip 12 are constructed for use with a standard perforated circuit board 14 having regularly spaced perforations 15 and a standard integrated circuit package 16 having a plurality of electrical leads 17. The standard spacing of the perforations 15 in the circuit board 14 is the same as the standard longitudinal space between electrical leads 17 of the integrated circuit package 16, as is illustrated.

The connector body 10 comprises an insulating housing 19 and a plurality of spring contact elements 21 retained in the housing 19. The insulating housing has a plurality of apertures therethrough, the aperture openings 23 at one face of the housing 19 are spaced to align with perforations 15 in the printed circuit board 14. The aperture openings 25 at the opposite face of the housing are longitudinally aligned with the aperture openings 23, but they are slightly off-set width-wise of the housing, as can be seen in FIG. 2.

One spring contact element 21 is retained in each aperture through the housing 19, the apertures being enlarged within the housing to receive and retain the spring contact elements 21 in position. Each spring contact element 21 is formed of a resilient metal strip into a generally S-shape to define a pair of adjacent, oppositely directed jaws 26 and 27. Each spring contact element 21 is positioned in the housing aperture with one pair or set of jaws 26 aligned with the aperture opening 23 which is aligned with a perforation 15 in the printed circuit board 14, while the oppositely directed jaws 27 are aligned with the aperture opening 25 in the opposite face of the housing 19.

The contact strip 12 comprises an insulating contact retainer 29 and a plurality of spring compression reserve wire contact elements 31. Two such contact strips 12 are illustrated, one corresponding to each row of electrical leads 17 of the integrated circuit package 16.

The insulating contact retainer has a plurality of contact apertures 23 therethrough, the illustrated apertures 33 extending straight through the contact retainer 29, and being longitudinally spaced to align with perforations 15 in the printed circuit board and the like aligned aperture openings 23 in the connector body housing 19.

One spring compression reserve wire contact element 31 is retained in each of the contact apertures 33. The contact elements 31 are generally planar, and each contact element is formed with a projection 34 in a portion thereof within the contact retainer 29 to firmly retain the contact element 31 in the aperture 33 through the contact retainer 29. Each contact element 31 is formed with a spring compression reserve wire contact slot 36 accessible at one surface of the contact retainer 29. The slot 36 in each element contact 31 is coined to make it progressively narrower from the open end thereof to assure effective electrical connection with two electrical conductors of the same diameter, as taught in U.S. Pat. No. 4,012,102. Each contact element 31 is formed with a tail 37 extending from the surface of the contact retainer 29 opposite the wire contact slot 36. Each contact tail 37 is sufficiently long to extend through a perforation 15 in the printed circuit board 14, through the aligned aperture opening 23 in the connector body housing 19 and into the aligned resilient jaws 26 of a spring contact element 21.

The tail 37 of each wire contact element 31 is slit longitudinally, centrally of its length and width, and it is similarly deformed transversely out of its plane in opposite directions along the sides of the slit to form oppositely directed leaf springs 39 and 40. The leaf springs 39 and 40 will deform to pass through a perforation 15, and will, when the contact retainer 29 rests on the upper surface of the printed circuit board 14, engage the periphery of the perforation 15 at two points on the lower surface of the printed circuit board 14 to retain the contact strip 12 on the printed circuit board 14 (See FIG. 3).

At its free end the tail 37 of each contact element 31 is formed with a protrusion 42 out of its plane. The protrusion 42 passes through the jaws 26 of the spring contact element 21 during assembly to firmly engage the inside of the jaws 26 to retain the connector body 10 on the printed circuit board 14 with the spring contact element 21 electrically connected to the corresponding wire contact element 31. The width of the enlarged portion of a connector body aperture in which a spring contact element 21 is retained is dimensioned to restrict the movement of the ends of the spring contact element 21. The expansion of the pairs of resilient jaws 26 and 27 is thereby restricted so that when an integrated circuit electrical lead 17 is inserted into the jaws 27 there is not sufficient room for expansion of the jaws 26 to permit passage of the protrusion 42 at the end of the contact tail 37. The connector body 10 and contact strip 12 are thus firmly locked onto the printed circuit board 14 when an integrated circuit package 16 is in position on the connector body 10.

In use, a connector body 10 is positioned on one side of a printed circuit board 14 and a pair of contact strips 12 are positioned on the opposite surface of the printed circuit board with the wire contact tails 37 aligned with the perforations 15 and the corresponding aperture openings 23 in the connector body housing 19. The contact strips 12 are then moved inward to move the contact tails 37 through the perforations 15, through the aperture openings 23 in the connector body housing 19 and into the jaws 26 of the spring contact elements 21. An integrated circuit package 16 is then positioned adjacent the lower surface of the connector body 10 and its generally planar electrical leads 17 move through the aperture openings 25 in the connector body housing 19 and into the aligned jaws 27 of the spring contact elements 21. The desired electrical connections through the integrated circuit package 16 are then made by pressing electrical wires into the slots 36 of the spring compression reserve wire contact elements 31.

While only one integrated circuit package 16 and the components of the electrical connector system of the present invention necessary to make contact to it are shown, it will be understood that there generally will be a multiplicity of similar appearing assemblies utilized in prototyping a complete electronic circuit.

We claim:

1. An electrical connector system for use with a perforated circuit board, comprising:
   a connector body comprising:
      an insulating housing having a plurality of apertures therethrough, the aperture openings at one face of said housing being spaced to align with perforations in a said circuit board, and
      a plurality of spring contact elements retained in said housing, one within each aperture therethrough, each said spring contact element being formed of a metal strip and having two adjacent oppositely directed pairs of resilient jaws for slidably receiving and releasably contacting oppositely extending flat plate conductors, one pair of jaws being aligned with an opening at said one face of said housing and the oppositely directed pair of jaws being aligned with the aperture's opening at the opposite face of said housing; and
   a contact strip comprising:
      an insulating contact retainer having a plurality of contact apertures therethrough, the aperture openings at one face of said contact strip being spaced to align with perforations in a said circuit board and said openings at said one face of said connector body housing, and
      a plurality of spring compression reserve wire contact elements, one in each of said contact apertures, each said spring compression reserve wire contact element having a spring compression reserve wire contact slot accessible at the face of said contact retainer opposite said one face thereof and having a tail extending from said one face of said contact retainer to fit through a perforation in a said circuit board and an aligned aperture in said one face of said connector body housing into the aligned resilient jaws of a spring contact element.

2. The connector system of claim 1 wherein said tail of each said spring compression reserve wire contact element is generally planar and is slit longitudinally centrally of its length and width, said tail being similarly deformed transversely out of its plane in opposite directions along the sides of said slit for passage through a perforation in a said circuit board and expansion to engage the circumference of the perforation to retain the contact strip on a said circuit board.

3. The connector system of claim 2 wherein said tail of each said wire contact element is formed with a protrusion out of the plane thereof adjacent its free end for passage through a circuit board perforation, an aperture opening at said one face of said connector body and the aligned jaws of a spring contact element to firmly engage the resilient jaws on the spring contact element to retain the connector body on a said circuit board with the spring contact element electrically connected to the wire contact element.

4. The connector system of claim 1 wherein said tail of each said wire contact element is generally planar and is formed with a protrusion out of the plane thereof adjacent its free end for passage through a circuit board perforation, an aperture opening at said one face of said connector body and the aligned jaws of a spring contact element to firmly engage the resilient jaws of the spring contact element to retain the connector body on a said circuit board with the spring contact element electrically contacted to the wire contact element.

5. The connector system of claim 4 wherein each said spring contact element is retained in an aperture in said housing in a manner so as to restrict the opening of said resilient jaws thereof to restrict removal of the tail protrusion of a wire contact element from said one set of jaws when a planar tail connection of a circuit element to be connected is inserted into the other set of jaws.

6. The connector system of claim 5 wherein said tail of each said wire contact element is generally planar and is slit longitudinally centrally of its length and width, said tail being similarly deformed transversely out of its plane in opposite directions along the sides of said slit for passage through a perforation in a said circuit board and expansion to engage the circumference of the perforation to retain the contact strip on a said circuit board.

* * * * *